(12) United States Patent
Zhang et al.

(10) Patent No.: US 6,416,685 B1
(45) Date of Patent: Jul. 9, 2002

(54) CHEMICAL MECHANICAL PLANARIZATION OF LOW DIELECTRIC CONSTANT MATERIALS

(75) Inventors: Fan Zhang; Feng Liu, both of Sunnyvale; Dan Towery, Santa Clara, all of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/547,187

(22) Filed: Apr. 11, 2000

(51) Int. Cl.[7] .............................................. C09K 13/00
(52) U.S. Cl. ..................................................... 252/79.1
(58) Field of Search ............................. 252/79.1, 79.5; 438/693

(56) References Cited

U.S. PATENT DOCUMENTS

| | | | |
|---|---|---|---|
| 5,772,780 A | * | 6/1998 | Homma et al. ................. 134/7 |
| 6,017,463 A | * | 1/2000 | Woo et al. .................. 252/79.1 |
| 6,174,454 B1 | * | 1/2001 | Tsai et al. ................... 252/79.4 |
| 6,191,040 B1 | * | 2/2001 | Glass .......................... 438/692 |
| 6,221,775 B1 | * | 4/2001 | Ference et al. .............. 439/691 |
| 6,232,231 B1 | * | 5/2001 | Sethurman et al. .......... 438/691 |
| 2001/0000497 A1 | * | 4/2001 | Epshteyn et al. ............ 438/691 |

* cited by examiner

Primary Examiner—Benjamin L. Utech
Assistant Examiner—Matthew Anderson
(74) Attorney, Agent, or Firm—Robert D. Fish; Sandra P. Thompson; Rutan & Tucker, LLP

(57) ABSTRACT

The present invention relates to apparatus, procedures and compositions for avoiding and reducing damage to low dielectric constant materials and other soft materials, such as Cu and Al, used in fabricating semiconductor devices. Damage reduction can be achieved by decreasing the role of mechanical abrasion in the CMP of these materials and increasing the role of chemical polishing, which can also improve material removal rates. Increasing the role of chemical polishing can be accomplished by creating a polishing slurry, which contains components that interact chemically with the surface to be polished. This slurry may or may not also contain soft abrasive particles, which replace the hard abrasive particles of conventional slurries. Use of soft abrasive particles can reduce the role of mechanical abrasion in the CMP process. Use of this slurry in CMP can reduce surface scratches and device damage.

4 Claims, 2 Drawing Sheets

CHEMICAL MECHANICAL PLANARIZATION OF LOW DIELECTRIC CONSTANT MATERIALS

BACKGROUND OF THE INVENTION

1. Technical Field

The present invention relates to the chemical mechanical planarization of surfaces. More particularly, the present invention relates to the planarization of relatively soft materials, typically low dielectric constant materials as encountered in the fabrication of integrated circuits.

2. Description of Related Art

Fabrication of integrated circuits ("ICs") to improve performance and reduce costs involves complex analysis of materials properties, processing technology and IC design. IC's consist of multiple layers of conducting, insulating and semiconductor materials, interconnected in various ways by conducting metallic channels and plugs ("vias"), including various dopants implanted into various materials for producing the electronic functionality desired of the IC. The near-universal trend in the manufacture of integrated circuits is to increase the density of components fabricated onto a given area of wafer, increase the performance and reliability of the ICs, and to manufacture the ICs at lower cost with less waste and fewer defective products generated by the manufacturing process. These goals lead to more stringent geometric and dimensional requirements in the manufacturing process. In particular, etching precise patterns into a layer is facilitated by the layer having a surface as nearly planar as feasible at the start of the patterning process. For the common case of patterning by means of photolithography, a planar surface permits more precise location and dimensioning for focusing the incident radiation onto the surface to be etched than would be possible with a surface having deviations from planarity. Similar conclusions typically apply for electron beam or other means of etching. That is, deviations from planarity of the surface to be etched reduce the ability of the surface to support precisely positioned and precisely dimensioned patterns. In the following description of the present invention we focus on the typical etching, planarization and photolithography processes as practiced in the manufacture of ICs. However, this is by way of illustration and not limitation, as those of ordinary skill in the art of etching will appreciate that the techniques of the present invention producing planar surfaces will have applicability in increasing the precision of etching by means other than photolithography. In addition, the present invention is not limited to the field of IC manufacture and may find applicability in other areas of technology requiring planar surfaces.

Chemical Mechanical Planarization ("CMP") has been successfully integrated into integrated circuit multilayer manufacturing processes to achieve highly planar surfaces as described in text books (for example, "Microchip Fabrication" by Peter Van Zant, 3rd Ed., 1997) and generally known in the art. We note that "CMP" is also used in the art to denote "Chemical Mechanical Polishing" as well as "Chemical Mechanical Planarization". We use CMP herein synonymously in either sense without distinction.

A typical CMP process is depicted schematically in FIG. 1. During a CMP process, the wafer, 1, is typically held inside a rotating carrier and pressed onto a rotating pad, 2, under pressure, 6, while an abrasive slurry, 5, (typically containing particles of abrasive such as $SiO_2$, $Al_2O_3$, and the like) flows between the wafer and the pad. The slurry, 5, will typically contain reagents for chemically etching the wafer, 1, leading to chemical as well as mechanical removal of material. Thus, in the typical practice of CMP, material removal is effected by a combination of chemical attack and mechanical abrasion.

Typically, the wafer, 1, will be caused to rotate as depicted by 4 in FIG. 1, while the polishing pad will itself rotate (3 in FIG. 1). FIG. 1 depicts the polishing pad and wafer rotating in the same direction (for example, clockwise when viewed from above as in FIG. 1). However, this is merely for purposes of illustration and counter-rotation of wafer and polishing pad is also practiced. In addition to the rotation of the wafer depicted by 4 in FIG. 1, the wafer, 1, may be caused to oscillate in the plane of the surface being polished, substantially perpendicular to the direction of the applied force, 6. Such oscillation is depicted as 7 in FIG. 1.

The necessary parameters for polishing $SiO_2$-based intermetal dielectric layers occurring in ICs have become well known in the semiconductor industry. The chemical and mechanical nature of polishing and wear of these $SiO_2$-based dielectric layers ("$SiO_2$ dielectrics") have been reasonably well developed. One problem with the $SiO_2$ dielectrics, however, is that the dielectric constant is relatively high, being approximately 3.9. Thus, to improve the electrical performance of ICs, it would be highly desirable to incorporate a low dielectric constant material into semiconductor structures while still being able to utilize the CMP systems for polishing the surface of the resulting dielectric material during the semiconductor wafer processing.

As the geometry of the integrated circuits continues to shrink, the intrinsic circuit delays will increase due to greater resistance in the metal interconnects and also due to undesired ("parasitic") capacitance effects arising from the circuit interconnects. Strategies being developed to reduce the parasitic capacitance effects include incorporating metals with lower resistivity values, such as copper, and providing electrical isolation with insulating materials having low dielectric constants relative to the $SiO_2$ dielectrics.

As described herein, "low dielectric constant materials" may occur in numerous physical and chemical forms, including organic polymer materials, porous dielectric materials, whether organic or inorganic, and mixed organic and inorganic materials, whether porous or not (examples include FLARE, SILK, HOSP, NANOGLASS, ELK, and Polyimides). Typically these low dielectric constant materials are polymer dielectric materials which include unique chemical and mechanical characteristics, including a relatively high concentration of organic materials. However, low dielectric constant materials may also include relatively highly porous materials (typically inorganic) or materials exhibiting a mixture or combination of properties and characteristics (organic, polymeric, porous, inorganic, etc.). The low dielectric constant films can typically be deposited utilizing a variety of techniques including chemical vapor deposition (CVD), physical vapor deposition (PVD) and spin coating. The polymer materials generally are mechanically soft and they readily exhibit plastic deformation and hence they easily can be scratched. In contrast, however, to their mechanical sensitivity, polymers are often chemically inert. The combination of the characteristics of the polymer dielectric materials makes use of a conventional aqueous based CMP process difficult.

Theoretically and practically, use of a hard CMP pad results in better planarity of the polished wafer while use of a soft CMP pad provides better surface qualities and uniformity of the polished films. The current generation of semiconductor devices (which are typically made containing tungsten and oxides) are typically planarized using CMP with an industry standard hard pad, such as the IC® pad, for primary planarization and a standard soft pad, such as the Politex® pad, for secondary buff polishing. However, using the standard IC® pad and the conventional abrasive slurries ($SiO_2$, $Al_2O_3$, $CeO_2$, and the like) to polish low dielectric constant materials, which typically are much softer than the conventional materials used in integrated circuits, tends to cause significant scratches on the polished surfaces of low dielectric films. Attempts to use soft pads like Polytex® pads to polish these soft materials have shown some success in avoiding severe scratches, but do not efficiently achieve good planarity in reasonable processing times. (S. P. Murkarka and R. Gutmann, 1994 Annual Report of the New York State SCOE, Semiconductor Research Corporation, Research Triangle Park, N.C. (1994)).

The abrasive particles typically used in conventional polishing slurries have a comparable mechanical strength, or hardness, to that of conventional device materials, such as oxide and tungsten. However, these particles' mechanical strength is typically much higher than that of low dielectric constant materials and other soft materials used in more recent embodiments of ICs, such as copper or aluminum. During polishing, the hard abrasive particles tend to penetrate deeply into the films of these soft materials and cause severe scratches. Conventional CMP slurries are also typically composed of inorganic chemical components that are reactive to inorganic materials such as oxides and metals, but do not actively react with the organic polymers that typically form the low dielectric constant material layers on the surface being planarized. Therefore, when conventional CMP methods are used in an attempt to planarize low dielectric constant materials, mechanical abrasion dominates the process, resulting in increased scratching and device damage. These surface scratches in device wafers can cause severe problems for subsequent processing steps, and can significantly reduce yields.

Thus, current standard hard and soft pads, and conventional abrasive particles and slurries are not suitable for CMP of softer materials such as low dielectric constant materials. Successful incorporation of these low dielectric constant materials into viable submicron fabrication techniques will necessitate the development of CMP processes which are not currently available utilizing the $SiO_2$-based CMP processes. Improved planarization of soft materials, typically low dielectric constant materials, is an important objective of the present invention.

SUMMARY OF THE INVENTION

The present invention relates to apparatus, procedures and compositions for avoiding and reducing damage to low dielectric constant materials and other soft materials, such as Cu and Al, used in fabricating semiconductor devices. Damage reduction can be achieved by decreasing the role of mechanical abrasion in the CMP of these materials and increasing the role of chemical polishing, which can also improve material removal rates. Increasing the role of chemical polishing can be accomplished by creating a polishing slurry which contains components that interact chemically with the surface to be polished. This slurry may or may not also contain soft abrasive particles, which replace the hard abrasive particles of conventional slurries. Use of soft abrasive particles can reduce the role of mechanical abrasion in the CMP process. Use of this slurry in CMP can reduce surface scratches and device damage.

Polishing pads with intermediate hardness are also included within the scope of the present invention. Such pads may be used with or without abrasive slurries and, when used with abrasive slurries, may be used with conventional slurries or with softer-than-customary abrasive particles (or coated abrasive particles). A balance is achieved between smooth surface finish and efficiency of polishing (material removal rate) by adjusting the polishing pad hardness to the surface to be planarized.

A two (or multi) step process is also envisioned within the scope of the present invention as a first planarization step (which may be conventional CMP or any of the improvements noted herein), followed by a buffing step. The subsequent buffing step(s) need not remove significant material as this has typically been accomplished by the preceding planarization step. Thus, the buffing step may be abrasive-free, utilize soft (or coated) abrasives and typically is gentler than a one-step process as the surface needs only to be buffed without substantial material removal as would be necessary for planarization.

BRIEF DESCRIPTION OF DRAWINGS

The drawings herein are not to scale.

DETAILED DESCRIPTION OF THE PREFERRED EMBODIMENTS

Chemical Mechanical Planarization (CMP) has been successfully integrated into fabrication processes for integrated circuits containing multiple layers. Dielectric CMP is performed typically to remove topography from the dielectric surface, that is, to planarize the dielectric surface. Such topography typically originates from the deposit of dielectric material on top of underlying metal structures. Metal CMP is typically performed to remove a blanket metal film thus revealing inlaid metal structures that act as conductive elements in the integrated circuits (IC's). Current IC designs incorporate multiple layers of conducting, insulating and semiconductor layers, typically having patterns therein formed by means of photolithography. The critical dimension requirements of current IC's require a wafer surface that is highly planar before beginning the photolithography patterning, hence the need for a very precise planarization process. Currently, conventional CMP is performed on polishing platforms with mechanical designs that are based on silicon wafer polishing tools. During CMP, an oscillating and rotating wafer, 1, is pressed against a rotating polishing pad, 2, with a total force $F_T$, 6. The wafer is held firmly by a retaining ring affixed to a gimbaled, rotating wafer carrier (not depicted in FIG. 1). Chemically active abrasive slurry, 5, is directed onto the pad 2 providing the necessary abrasive mechanism as depicted schematically in FIG. 1. The polishing pad, 2, is typically composed of polyurethane, or polyurethane impregnated fiber, and is typically attached to a rigid, temperature-controlled platen. Current thinking holds that during CMP the wafer is supported by hydrodynamic forces, and by direct support from abrasive particles resting on pad asperities at the pad-wafer interface.

Figure 1:
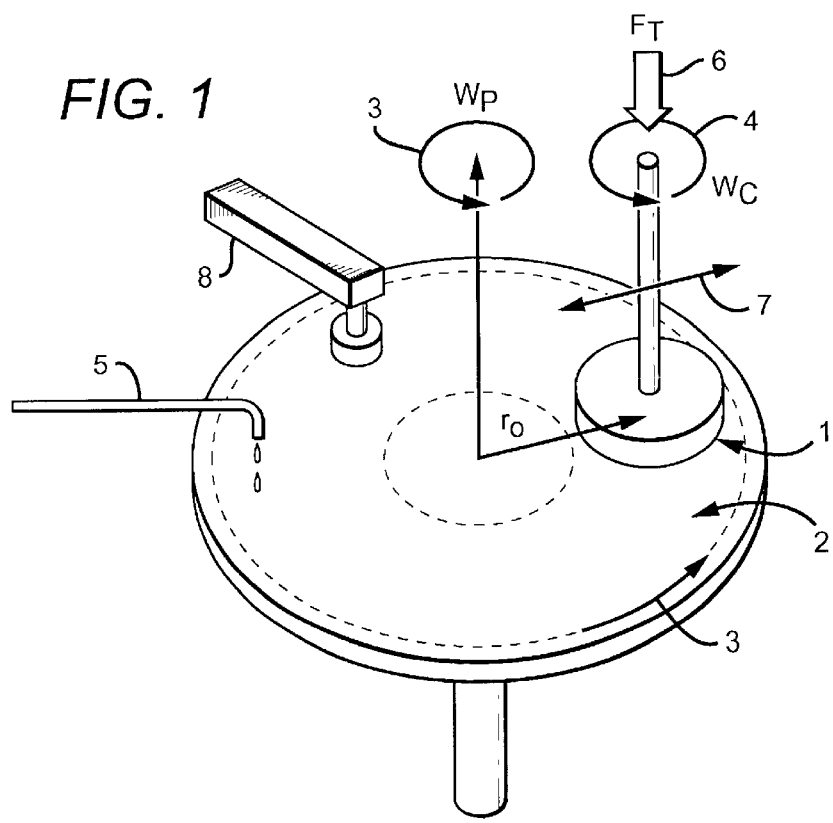
FIG. 1 is a schematic depiction of Chemical Mechanical Planarization ("CMP") including wafer, polishing pad and pad conditioning implements.

Conventional CMP requires an additional support process referred to as "pad conditioning." Pad conditioning is typically performed with diamond-impregnated ring or disk tools that are generically referred to as "conditioners" and denoted by 8 in FIG. 1. During conditioning the conditioner, 8, is typically pressed against the rotating polishing pad, 2. The pressure and relative motion of the diamond abrasives against the polishing pad erode a small amount of pad material. Pad erosion is required to keep the surface of the pad free of the material build-up associated with the reaction products of CMP, i.e., spent abrasives, and removed material from the wafer surface (typically dielectric). Pad conditioning also maintains the micro-texture of the pad, which is useful in that the pad tends to smooth during CMP in response to heat-induced viscoelastic flow of the pad material. Without pad conditioning the removal rate and uniformity of the dielectric material (or other material from the surface undergoing planarization) tends to be variable from wafer-to-wafer making a production-worthy CMP process impossible. A pad conditioning process whereby pad conditioning and wafer polishing occur simultaneously is referred to as "in-situ" conditioning, as depicted in FIG. 1. When pad conditioning occurs following the polishing of one wafer and prior to polishing another, the conditioning process is called "ex-situ" conditioning.

The size of the conditioning tool (or tools) depends on the particular CMP platform being used, but are usually smaller in diameter than the polishing pad. This situation is depicted in FIG. 1. "Ring-conditioning" tools are usually larger than the wafer diameter. In practice, ring-conditioning tools are positioned at a fixed radial distance from the polishing pad's rotational axis and do not undergo oscillatory motion. At this location the ring-conditioner rotates and provides the required erosion in the "wafer-track". The wafer-track is an annular zone on the polishing pad where the oscillating wafer resides during CMP. "Disk conditioners" are typically smaller than the wafer, their use typically requires that they oscillate across the pad surface to provide the necessary coverage of the wafer-track.

Figure 2:
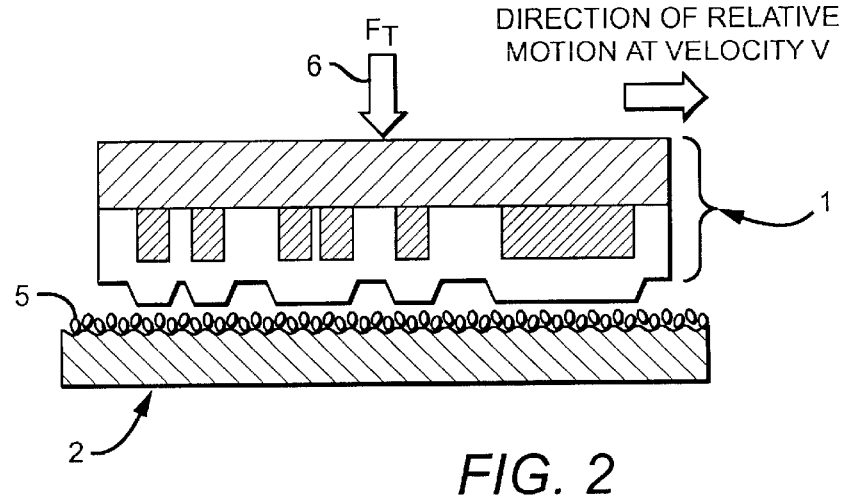
FIG. 2 a schematic cross-sectional view of a typical multi-layer integrated circuit undergoing planarization.

During pad conditioning, the location and rotation rate of the conditioning tools affect the uniformity of erosion in the wafer-track, and this influences the removal rate stability and polishing uniformity of the dielectric CMP process. In practice, CMP continues for a predetermined time to affect the removal of the desired amount of material. The appropriate processing time is typically determined by means of a calculation making use of knowledge of the material removal rate (for the abrasive, wafer, pad, pressure, etc. in use) and the required material removal amount. The removal amount is chosen such that at the end of CMP, the planarized surface is essentially free of topography (i.e., substantially flat) and has the required final thickness. Typical industrial CMP processes presently in use have pad-wafer pressures of about $48 \times 10^3$ Pa (7.0 psi), a relative velocity between pad and wafer of about 0.54 meter/sec. and a total processing time of about 3 minutes. FIG. 2 depicts an enlarged schematic cross-sectional view of CMP in progress on an idealized patterned wafer.

It requires no detailed analysis to appreciate that during CMP regions of high topography are subjected to a higher localized contact pressure in comparison with low lying regions. Assuming the pad is comprised of numerous spring elements, it follows from Hooke's law that compressed pad regions direct larger forces onto the higher regions of the wafer topography. It is this property that gives CMP the ability to selectively remove elevated topographic features (that is, planarize) while minimizing removal in the regions between the raised features.

Current multi-layer IC fabrication schemes typically utilize dielectric CMP processes, including CMP of inter-level dielectric (ILD) materials (typically involving CMP of $SiO_2$, but may also include organic and/or inorganic low dielectric constant materials), metal CMP processes (typically involving CMP of tungsten, titanium and/or titanium nitride, but may also include various alloys and mixtures of aluminum, copper, tantalum and tungsten). One recent application of CMP referred to as "shallow trench isolation", or STI, involves fabricating isolation structures around active device areas on the wafer. During STI a blanket dielectric film (typically involving CMP of $SiO_2$, but may also include organic and/or inorganic low dielectric constant materials) is removed so as to reveal inlaid dielectric filled trenches that surround the active device regions thus providing an electrical isolation "moat".

Slurries designed for the CMP of conductive layers, such as tungsten and copper, typically contain $Al_2O_3$ or $SiO_2$ abrasive and various chemical additives such as acids, oxidizers and buffering agents in an aqueous suspension to remove the metal layers efficiently by increasing the capability of chemical polishing. Examples of commercially available tungsten slurries include Rodel QCCT 1010® and Cabot WA-355®. Slurries designed for oxide layers typically include $SiO_2$ abrasive in an $NH_4OH$-based or KOH-based aqueous suspension. Examples of commercially available $SiO_2$ slurries include Rodel 1501-50°, Rodel 1508-50®, and Cabot SS25®. Commercially available STI slurries from Cabot and Rodel are often based on $SiO_2$ abrasive, but also may include $CeO_2$ abrasive. Experimental copper CMT slurries typically contain $SiO_2$ or $Al_2O_3$ abrasive.

The CMP processes described above may usefully be designated as precision polishing applications, and thus require a very precise and controlled material removal rate across the IC wafer. In addition, the final surface quality and smoothness requirements are also rather demanding relative to many other polishing processes. In order to achieve these requirements, the abrasive used in the CMP slurry are typically chosen to have a very precise particle size and shape, and the abrasive must form a very stable suspension so as to avoid particle agglomeration. Deviations from the ideal abrasive specifications often result in poor CMP performance, poor suspension stability and particle agglomeration. Particle agglomeration is particularly troublesome because it leads to increased scratching on the surface being polished. Such scratches can lead to electrical shorts across adjacent metal lines (in the case of a scratched ILD layer), defective or damaged conductive structures (as in metal CMP) or poor electrical isolation (as with STI).

During CMP, dielectric material is typically removed by the combined action of chemical and mechanical processes. Chemical energy is supplied by the slurry's liquid media, or in some cases by the abrasives themselves. CMP slurries are typically aqueous based, and are usually either acidic, or basic. Mechanical energy is generated by dragging the dielectric against a semi-rigid surface (the polishing pad) with an abrasive slurry entrained at the wafer-polishing pad interface. The relative motion generates mechanical energy W in accordance with the principle of mechanical work $$W = \int F_T \mu_s \cdot ds \quad (1)$$

Where $F_T$ is the total force normal to the wafer surface, $\mu_s$ is the coefficient of sliding friction between the wafer and the pad, and ds is a differential element of length. By transforming the differential element of length to a differential element of time we obtain $$W = \int F_T \mu_s \cdot v dt \quad (2)$$

where v is the relative linear velocity between the polishing pad and the wafer. Integration of Eq. (2) yields the total work generated during the specified time domain. Thus increasing $F_T$, $\mu_s$, v, or the polishing time t, increases the material removal during polishing. F. W. Preston recognized the relationship between work and material removal and formalized the relationship in the Preston equation. Stated in differential form the Preston equation is $$\frac{dh}{dt} = K_p P \frac{ds}{dt} \qquad (3)$$

where $K_p$ is the Preston Coefficient, P is the polishing pressure acting normal to the wafer surface, and ds/dt is the instantaneous relative velocity between the polishing pad and the wafer surface. The Preston Coefficient is thought to depend on several factors including the material type being polished, the concentration and type of abrasive used in the slurry, and the slurry pH. Equation (3) can be rewritten as $$\Delta h A = K_p F_T V \Delta t \qquad (4)$$

where A is the total projected contact area. Equation (4) implies that the volume of material removed will be proportional to the applied force, the relative velocity, and the total process time. The form of Eqs (2) and (4) imply that $K_p$ is related to $\mu_s$. It has been theorized that removal mechanisms in glass polishing were related to the frictional force of individual polishing abrasives acting as Hertzian indenters as they traversed the glass surface. In these models the magnitude of these frictional forces was related to the normal load acting on the individual particles, and to the number of bonding sites on the particle that could interact with the glass surface. The bonding site density was shown to depend on the pH of the aqueous slurry, and the iso-electric point ("iep") of both the glass surface and the abrasive.(O. Kuvaschewsi, E. Evans and C. Alcock, Metallurgical Thermochemistry, Pergamon Press, Oxford (1967); G. A. Parks, Chem. Rev. 65, 177, 1965).

Aqueous (water) based slurries have been overwhelmingly preferred in CMP processes. In these slurries, the pH is typically adjusted to either the acidic side, or the basic side of the pH scale using appropriate chemicals. Oxidizing agents are typically used in metal CMP slurries to aid in promoting corrosion reactions on metal surfaces. Organic and inorganic acid salts may also be added to improve metal removal rate and removal of abraded material. Surfactants may also be added to impart stability and to provide lubricity. Chelating agents purportedly increase material removal rates from the surface. Co-solvents, such as alcohols or glycols, may have similar, (or the reverse) effects on material removal rates and may be selected as desired by the process engineer for proper material removal. By adjusting the various chemical aspects of the slurry, the polishing efficiency (removal rates) for a given abrasive-wafer system can be controlled. For example it has been shown that solubility of $SiO_2$ increases as solution pH increases (from pH 7) (R. K. Iler, The Chemistry of Silicon, John Wiley & Sons Inc., New York (1979)). Hence high pH slurries are generally more efficient polishing agents for $SiO_2$-based materials. This generalization depends somewhat on the abrasive and the material being polished but illustrates the impact of chemistry on the slurry performance as predicted by the more sophisticated interpretation of Preston's equation (which may also include binding site density effects). (F. Preston, J. Soc. Glass Tech. 11, 214, 1927).

Currently, CMP abrasives are typically formed solely from one homogeneous material type. Examples include abrasives formed of $Al_2O_3$, $CeO_2$ and $SiO_2$. These metal oxide abrasives may be segregated into two categories; chemically active oxides, and chemically inactive oxides. The former pertains to those metal oxide compounds that have multiple valence states. These compounds can undergo oxidation-reduction reactions under certain circumstances. Cerium (Ce) is an example of a metal with chemically active oxide. For example, ceria ($CeO_2$) occurs in forms in which Ce is in its +3 and +4 valence states, and accordingly can undergo the following reversible oxidation-reduction reaction:

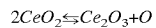

$$2CeO_2 \leftrightarrows Ce_2O_3 + O$$

One approach to the scratching and other problems associated with the use of abrasive particles described herein makes use of coated abrasive particles. The coated particle technology described herein consists of a core particle of one material, and an outer coating of another material. However, for the purposes of this invention the slurry could be comprised of abrasive particles of a homogenous mixture of two or more types of materials (in one particle), or the abrasive slurry could consist of a mixture of numerous homogenous or composite abrasives.

In addition to the ceria oxidation-reduction noted above, still other chemical reactions may be possible with other materials, and thus the coated abrasive technology applies broadly to any number of core materials and coating materials, and not only metal oxides. It may be feasible to harness such chemical reactions in order to improve the performance of CMP processes. For example, a slurry comprised of chemically active abrasive(s) might provide a higher material removal rate for a given amount of mechanical energy input (i.e., polishing pressure), or they may provide a higher removal rate on certain material types while minimizing the material removal rate on another material type, and thus provide a desirable removal rate selectivity for some polishing processes. However, these active materials may be more expensive, have a higher material density, or in some cases may have undesirable impurities relative to $SiO_2$, or other suitable materials. Thus, their desirable attributes are mitigated to some degree by their undesirable properties. Hence, finding methods that take advantage of the CMP enhancements realized from the chemical properties of certain materials while reducing their undesirable attributes would be useful.

The core material can be chosen from any number of organic or inorganic materials to reduce cost, density, and to improve the purity of the final abrasive particle, whereas the outer coating/shell, or secondary phase (as with the homogeneous composite particle) may be chosen for its chemical activity/properties.

The particle density will affect its ability to stay in suspension according to Stoke's Equation. Stoke's equation predicts that the height H that a particle of diameter d will settle in a fluid column in a time t is:

$$H = \frac{a^2(\rho_p - \rho_L)gt}{18\eta} \qquad (5)$$

Where η is the fluid viscosity, g is the gravitational constant, and $\rho_p$ and $\rho_L$ are the particle and fluid densities respectively. Thus, for example, a 70 nanometer $SiO_2$ core (density=2.2), coated with a monolayer $ZrO_2$ shell (density= 5.6), has an effective density of only 2.8, and would have a settling rate that is only half that of a solid $ZrO_2$ particle of equivalent size. The density comparison between a solid CeO$_2$ particle ($\rho_p$=6.95) and a particle with a monolayer of CeO$_2$ coating a 70 nm SiO$_2$ core is even more dramatic Continuing with the ZrO$_2$ coated SiO$_2$ core particle described above, the lower density (~½ that of a solid ZrO$_2$ particle) will result in nearly twice the number of slurry particles for a given weight percent (wt %), or solids loading, of abrasive in suspension. Those skilled in the art will appreciate that, in general, a higher solids loading will increase removal rate for a given set of polishing process conditions (polish pressure, polish velocity, slurry chemistry). This is clear from the perspective that more particles present more "cutting" surfaces with which to effect material removal. Moreover, by virtue of the larger number of particles, the penetration depth (scratch depth) of each individual abrasive particle is reduced, thus providing a smoother, relatively damage free final surface.

Figure 3:
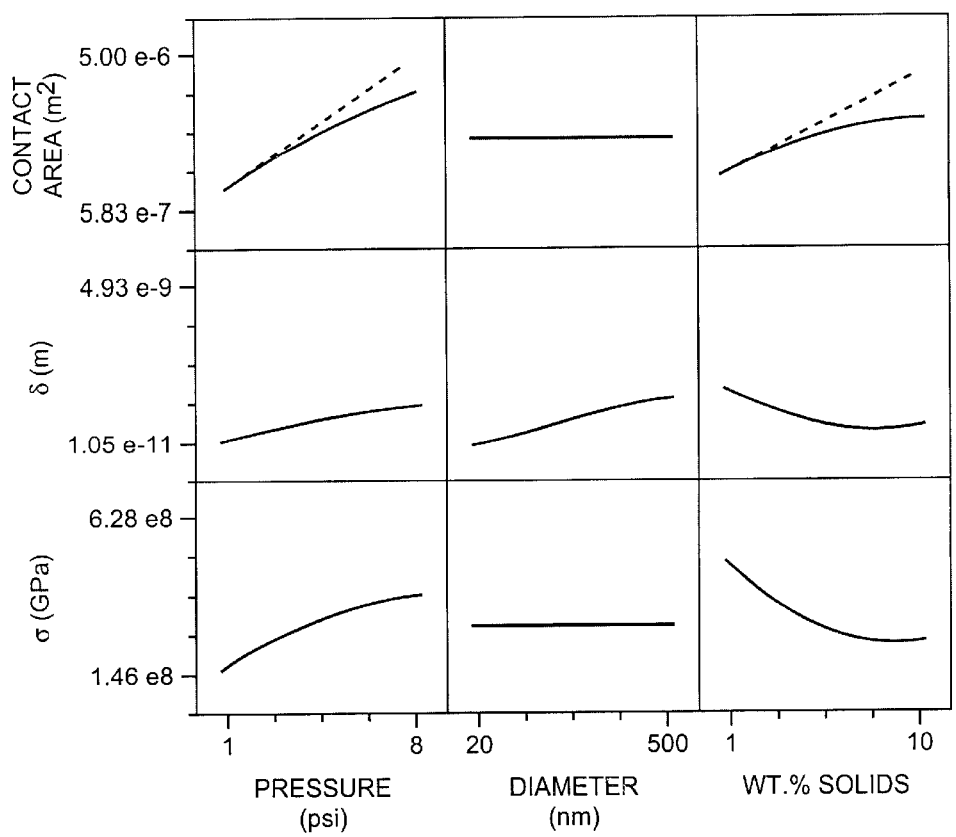
FIG. 3 results of mathematical model examining combined effect of wt % abrasive, abrasive diameter and polishing pressure on particle penetration depth δ, cumulative contact area and compressive contact stress σ.

A mathematical model was used to examine the combined effect of wt % of abrasive, abrasive diameter and polishing pressure on particle penetration depth ($\delta$), the cumulative contact area between the wafer and all particles in contact with the wafer, and the compressive contact stress ($\sigma$) between a single particle and the wafer surface The results are given in FIG. 3. The particle is assumed to have a density of 4.0 g/cc and the work surface is taken to be an organic low dielectric constant material (such as the polyarylene ether, FLARE™ from Honeywell Corporation) that has a modulus of approximately 3 GPa. Results depicted in FIG. 3 indicate that increasing the abrasive solids content of the slurry increases the cumulative contact area between the abrasives and the wafer surface, while simultaneously reducing the contact stress and penetration depth (and therefore damage) between the particle and the wafer surface. The composite coated particle having a particular coating (ZrO$_2$ in this example) will take on the chemical properties (reactivity, isoelectric properties, coordination attributes, etc.) of the solid coating (ZrO$_2$). The cost and purity of the abrasive composition will approach that of the core material present in much higher quantity than the coating (SiO$_2$ in the present example). The mechanical hardness approaches that of the surface coating. A useful abrasive is thus constructed with a hard surface coating surrounding a softer (typically less expensive) core material.

The deleterious scratches caused by performing CMP with hard, abrasive slurries, (and that are sought to be reduced by the present invention) are believed to be chiefly due to the deep penetration of the surface by hard slurry particles. Conventional abrasive particles such as SiO$_2$, Al$_2$O$_3$, CeO$_2$, SnO$_2$, or ZrO$_2$, typically have mechanical strengths comparable to oxides and tungsten, but tend to be much harder than low dielectric constant polymers or soft metals such as copper and aluminum. Severe scratches readily result. Commercially available slurries of the types noted elsewhere herein are typically made from inorganic constituents which tend to be reactive to materials such as oxides and metals but tend not to react with organic materials. Thus, use of conventional slurries with organic polymers loses much of its effectiveness in removing materials by chemical means. Thus, abrasion dominates and scratches easily result.

An approach to avoidance of scratches is to make use of soft abrasive particles. These soft abrasive particles are selected to have a hardness comparable to the hardness of the low dielectric constant materials to be planarized. Although the use of soft abrasive particles will tend to reduce the role of mechanical abrasion in the CMP process, chemical effects may be used to compensate. Soft abrasive particles may be made from polymers, including, but not limited to polystyrene-acrylonitrile, Nylon-6, polyoxymethylene, polyurethane and poly(para-divinylphenylene). These soft particles will also typically have a charge opposite that of the surface to be polished (opposite zeta potential), increasing the role of chemical polishing and enhancing removal rates. Other kinds of organic polymer particles, with the appropriate hardness and charge, can be used to meet the planarization and polishing needs of various low dielectric constant materials and other soft materials that may be developed.

The abrasive particles may be coated with a thin layer of a softer material to reduce scratching where the coating may be chemically active or inactive material. Typically, these particles' surface charge (zeta potential) will be the opposite of the surface charge of the film to be polished. The advantage of using coated particles is realized when the density of the coated particles is less than the density of particles made entirely from the coating material. The reduced density makes the particles more stable in terms of particle settling according to Stokes Law, which predicts a larger settling velocity for particles having a higher density. Similarly, for a given wt % of solids, slurries comprised of coated particles which are less dense will have a greater number of particles in a given volume of fluid, referred to as a greater solids loading. The immediate advantage of a greater solids loading is that there are more particles to contact the surface of the film to be polished and therefore the removal rate is increased.

In one embodiment of the present invention, the role of mechanical abrasion is reduced by using a polishing pad that is of comparable hardness to the low dielectric constant material to be polished, i.e., a polishing pad that is softer than the standard hard IC pad and harder than the Politex pad. Use of this optimized pad in CMP of low dielectric constant materials and other soft materials can improve surface quality—reduce scratches—while achieving acceptable planarity. The optimized pad can be developed by adjusting pad production processes, which include baking and curing temperature, time and other parameters. This optimized pad may also be used in a primary polishing step with a conventional, commercially available slurry. Additionally, this optimized pad may be used in a primary polishing step with a specially designed slurry, such as the slurries described above, with or without conventional or soft abrasive particles.

In another approach to the CMP of the present invention, the primary polishing step is accomplished with a conventional pad and a slurry containing the soft particles described above. Additionally, the soft particles may be used with the chemically reactive slurry components described above for the primary polishing step. In another embodiment, the primary polishing step is accomplished with the chemically reactive slurry described above without the use of soft particles. In another embodiment, the chemically reactive slurry described above is used with conventional abrasive particles for the primary polishing step.

In another embodiment, surface scratches that occurred during a primary polishing step, either a conventional CMP primary polishing step or one of the primary polishing steps described above, are removed by a buff polishing step. In one embodiment, a standard, commercially available soft pad is used in the buff polishing step. In another embodiment, an optimized pad as described above is used in the buff polishing step. In one embodiment, the slurry used in the buff polishing step includes the composition described above without abrasive particles. In another embodiment the buff polishing step includes the slurry composition described above with standard or soft abrasive particles. In addition to abrasive slurry particles, reactive chemicals may be contained in the CMP solution. Table A lists typical chemical components that may be included in the slurry. The slurry may have the opposite zeta potential charge to the surface to be polished, which may typically be comprised of a low dielectric organic polymer

TABLE A

I. Abrasive Particles

1. Conventional Slurry Abrasive Particles; such as $SiO_2$, $Al_2O_3$, $CeO_2$, $SnO_2$, $ZrO_2$.
2. Polymer Particles; such as polystyrene-acrylonitrile, Nylon-6, polyoxymethylene, polyurethane and poly(para-divinylphenylene) ("polyPDVP")
3. Other Particles; chemically active and inactive particles.
4. Particles (1)–(3) above with a softer coating and, preferably, the softer coating has a surface potential opposite to the film undergoing planarization.

II. Solvents

1. Water
2. Organic Solvents; such as anisole, cyclohexanone, N,N-dimethylacetamide N-methyl-2-pyrrolidone, dioxane, tetrahydrofuran, diethyleneglycol.
3. Organic Acids; such as alkyl acids with differing alkyl chain lengths and structures for various polishing applications including methyl, ethyl, propyl, butyl and cyclohexyl.
4. Organic Bases; such as organic amines having various chain lengths and functional substituents including propyl, butyl, hexyl, octyl, dodecyl, possibly including one or more hydroxyl groups for increased solubility in water.
5. Other acids; such as nitric acid, hydrochloric acid, phosphoric acid.

III. Other Additives

1. Dispersants; such as lignin sulfonates, sulfosuccinates.
2. Oxidizing Agents; such as ferric nitride, hydrogen peroxide, quinone and substituted quinones.
3. Corrosion Inhibitors; such as benzotriazole ("BTA"), perfluorocarboxylic acid salts, fluorosurfactants.
4. Chelating Agents; such as ethylene-diamine-tetra-acedic acid ("EDTA"), citric acid.
5. Surface Modifying Agents and Wetting Agents; such as phosphate esters, sulfated ethoxylates of fatty alcohols, alkyl phenol polyethoxylates, dimethyl siloxane polymer (with hydrophilic substituent).
6. Surfactants; such as lipophilic/hydrophilic groups linked by alkyl chain having length from 8 to 18 carbons including hydroxyl, ammonium and sulfuric, polyoxyethylenealkyl ethers.
7. pH buffers; such as phosphoric acid and citric acid.

Reactive organic solvents, such as those listed in Table A, can be added to the slurry to increase the role of chemical polishing in the CMP process. Based on the structure and composition of the low dielectric constant material films, which are often organic polymers, the corresponding organic solvents are selected to improve the chemical reaction with the films. The organic solvents of the slurry soften the surface of the films evenly and break chemical bonds selectively.

Wetting agents, such as those listed in Table A, can be used in the slurry. The organic polymer surfaces typically used in low dielectric constant films are often hydrophobic—resistant to interaction with water. Wetting agents can be introduced to improve contact between the low dielectric constant film and the solvent, which can enhance the role of chemical polishing.

If particles are used in the slurry, chemical dispersants such as those listed in Table A, can be introduced in the slurry to prevent the formation of large particles during the polishing. Without larger particles in the slurry, smaller particles will not cause severe surface scratches. This can reduce mechanical abrasion and can reduce surface scratches.

In summary, the present invention provides several techniques for avoiding or reducing surface scratching in the planarization of soft materials, typically low dielectric constant materials as encountered in the fabrication of integrated circuits. On embodiment entails making use of a polishing pad with moderate hardness as a compromise between smoothness of surface and effective rates of material removal. Intermediate hardness can be achieved by modification of the process of pad manufacture, including baking and curing temperatures and times as well as other pad processing parameters. Such a pad may make use of traditional slurries or slurries modified as noted above.

Another embodiment makes use of soft slurry particles such as organic polymer particles, conventional slurry particles coated with a softer coating, in conjunction with other chemically active or inert components. The possible particles and chemical compositions are given above, especially in Table A. With such a tailored slurry, planarization may be performed with a commercially available, or a tailored pad may be employed. Slurry particles having an opposite surface from that carried by the surface undergoing planarization is also advantageous.

Avoidance or reduction of scratching may be achieved by means of a slurry lacking abrasive particles, relying on chemical material removal to achieve planarization. Table A gives possible chemical compositions for such planarization., to be performed with a conventional polishing pad or one having controlled, intermediate hardness as described above.

Yet another approach to the reduction/avoidance of scratches of soft surfaces during planarization makes use of a subsequent "buffing" step following surface planarization. That is, following conventional planarization, (or following any of the special soft planarization techniques described herein), a relatively mild buffing step is performed. It is envisioned that the buffing step will remove abrasive particles remaining on the surface following the primary planarization, as well as remove scratches. Thus, the buffing step need not be capable of removing the material needed for overall planarization. Rather the buffing step need only remove enough material for a final planarization of the surface. Conventional or tailored polishing pads may be used. Soft-slurry or no-slurry (chemical only) compositions may be used in this buffing step.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. An abrasive slurry for the planarization of a low dielectric constant surface comprising abrasive particles having a hardness substantially equal to the hardness of said surfaces, wherein said abrasive particles have a surface charge opposite to that of said surface, and wherein the abrasive particles are polymers.

2. An abrasive slurry as in claim 1 wherein said abrasive particles are selected from the group consisting of polystyrene-acrylonitrile, Nylon-6, polyoxymethylene, polyurethane and poly(para-divinylphenylene) and mixtures thereof.

3. An abrasive slurry as in claim 1 wherein said abrasive particles comprise a coating on a core wherein said coating material is softer than said core material.

4. A method of planarizing a low dielectric constant surface comprising performing a conventional chemical mechanical planarization followed by buffing with an abrasive slurry wherein said abrasive slurry has a hardness less than or substantially equal to the hardness of said surface, and wherein the abrasive slurry comprises polymeric abrasive particles.

* * * * *